United States Patent [19]

Forney, Jr.

[11] Patent Number: 4,562,426
[45] Date of Patent: Dec. 31, 1985

[54] SYMBOL CODING APPARATUS

[75] Inventor: George D. Forney, Jr., Cambridge, Mass.

[73] Assignee: Codex Corporation, Mansfield, Mass.

[21] Appl. No.: 439,740

[22] Filed: Nov. 8, 1982

[51] Int. Cl.[4] ............................................. H03K 13/24
[52] U.S. Cl. ................................ 340/347 DD; 375/27
[58] Field of Search ............ 340/347 DD; 371/43–45; 375/27, 38, 39; 332/9 R

[56] References Cited

U.S. PATENT DOCUMENTS

| | | | |
|---|---|---|---|
| 3,887,768 | 6/1975 | Forney, Jr. et al. | 375/42 |
| 4,077,021 | 2/1978 | Csajka et al. | 340/347 DD |
| 4,114,710 | 9/1978 | Katoh et al. | 375/39 |
| 4,483,012 | 11/1984 | Wei | 375/27 |
| 4,493,082 | 1/1985 | Cumberton et al. | 371/43 |

OTHER PUBLICATIONS

Ungerboeck, "Channel Coding With Multilevel Phase Signals", IEEE Transactions & Theory, vol. IT-28, #1, 1/82.
Forney, "The Viterbi Algorithm", Proceedings of the IEEE, vol. 61, #3, 3/73.

Primary Examiner—Vit W. Miska

[57] ABSTRACT

In apparatus for transmitting digital symbols over a band-limited channel using a modulated carrier system by encoding the symbols into discrete signals selected by a finite state encoder from a signal alphabet comprised of subsets each corresponding to transitions from a particular previous state to a particular current state of the encoder, the improvement in which at least two of the subsets have a signal in common, and at least one signal belongs to only one of the two subsets.

17 Claims, 12 Drawing Figures

SYMBOL CODING APPARATUS

BACKGROUND OF THE INVENTION

This invention relates to transmitting digital symbols over band-limited channels using a modulated carrier system of the type including an encoding circuit for encoding said symbols into discrete signals selected from an available signal alphabet, and in which dependencies are introduced between successive signals in the sequence to increase immunity to noise and distortion.

In conventional data transmission systems in which N-bit data symbols are each represented by a unique signal drawn from an alphabet of $2^N$ such signals, each selection of a signal to be transmitted depends only upon the data symbol represented by that signal; there is thus a one-to-one correspondence between the set of $2^N$ different data symbols and the signal alphabet.

Csajka et al., U.S. Pat. No. 3,877,768, and Ungerboeck, "Channel Coding with Multilevel/Phase Signals," IEEE Transactions on Information Theory, Vol. IT-28, No. 1, January, 1982, describe systems in which each signal selection depends not only upon the symbol to be represented, but also upon previous signal selections. The conventional $2^N$ signal alphabet is doubled in size to $2^{N+1}$. An encoder maps the $2^N$ different data symbols into $2^{N+1}$ different coded symbols, each represented as N+1 bits. Finite-state memory in the encoder causes each (N+1)-bit coded symbol to depend not only on the current N-bit symbol but also on the previous data sequence which is reflected in the state of the finite-state memory. The (N+1)-bit coded symbols are then represented by a sequence of alphabet signals. The alphabet signals are divided into subsets which are disjoint (i.e., have no signals in common), each subset corresponding to transitions from one state to a particular subsequent state of the finite-state memory. The effect of the coding is to permit only certain sequences of alphabet signals to be transmitted, and the coded dependency information carried by every signal is exploited at the receiver through use of a maximum likelihood sequence estimation decoding technique (e.g., one based on the Viterbi Algorithm, as described in *Forney*, "The Viterbi Algorithm," Proceedings of the IEEE, Vol. 61, No. 3, March 1973, incorporated herein by reference); in such a technique, instead of decoding each received signal independently into the alphabet signal most likely to have been sent (i.e., the alphabet signal closest to the received signal in the sense of Euclidean distance, if the noise can be regarded as Gaussian), decoding decisions are delayed for a predetermined number of signal intervals to permit each decision to be made in a way that results in a sequence of received signals being decoded into the sequence of alphabet signals most likely to have been sent (i.e., into the sequence of received signals closest in the sense of the algebraic sum of Euclidean distances or vector Euclidean distance).

The so-called coding gain (i.e., increased resistance to Gaussian noise) achieved by Csajka and Ungerboeck is of course reduced by the additional power needed to transmit the larger signal alphabet, subject to maintaining the same minimum distance between signal points.

SUMMARY OF THE INVENTION

In general, the invention features, in apparatus in which the encoding circuit includes a finite-state device whose state depends on previous symbols and the signal alphabet includes a plurality of subsets each corresponding to transitions from a particular previous state to a particular current state, that improvement in which at least two of the subsets contain at least one signal in common, and at least one signal belongs to only one of the two subsets. A substantial coding gain is thus achieved with a relatively small increase in alphabet size, simplifying implementation.

In preferred embodiments, the size of the alphabet of symbols is $2^N$, and the size of the signal alphabet is larger than $2^N$ and smaller than $2^{N+1}$; the selection of some signals (belonging to a first group) is made without regard to the state of the device, and the selection of other signals (belonging to a second group) depends on the state of the device; the alphabet comprises a plurality of types of signals (e.g., different types arranged alternately along the dimensions of a rectangular grid on the complex signal plane), the distance between adjacent signals belonging to the same type being greater than the distance between adjacent signals belonging to different types, and the current state depends on the type of each signal selected and on the previous state of the device, whereby the minimum free distance between contending signal sequences is increased, permitting a coding gain to be realized; the subsets each comprise quadruplets of signals located at the same distance from the origin of the complex signal plane but separated by 90° intervals about the origin, and the symbols are quadrantally differentially encoded, whereby the signal alphabet is immunized from transmission phase hits of integral multiples of 90°; all of the first group of alphabet signals are as close or closer to the origin on the complex signal plane than are the second group, and on average no more than ½ of the signals selected belong to the second group, whereby the additional transmission power required by the added signals (in excess of $2^N$ signals) is relatively small; there is a demodulator comprising a decoder of the type which delays the decision of which signal was transmitted until a number of subsequent signals have been received, the decision being made based on maximum likelihood sequence estimation, and wherein the number is selected to assure to a predetermined probability that the subsequent signals will include at least one signal belonging to the second group, whereby the coding gain is obtained even though not every signal carries information determinative of the sequence of states; the decoder is arranged to make tentative decisions of which signal was transmitted before all of the subsequent signals have been received, and the demodulator has adaptive control circuitry arranged to respond to the tentative decisions, whereby the control circuitry adapts relatively quickly even though the final decoder decisions are delayed; the signals are arranged in a hexagonal grid on the complex signal plane, whereby a further coding gain may be attained; there are no more than 1.5 times $2^N$ signals; the modulated carrier system is double side-band or single side-band; and N is 6, there are 80 signals, and there are 2 states.

Other advantages and features of the invention will be apparent from the following description of the preferred embodiment and from the claims.

DESCRIPTION OF THE PREFERRED EMBODIMENT

We first briefly describe the drawings.

Drawings

STRUCTURE AND OPERATION

Figure 1:
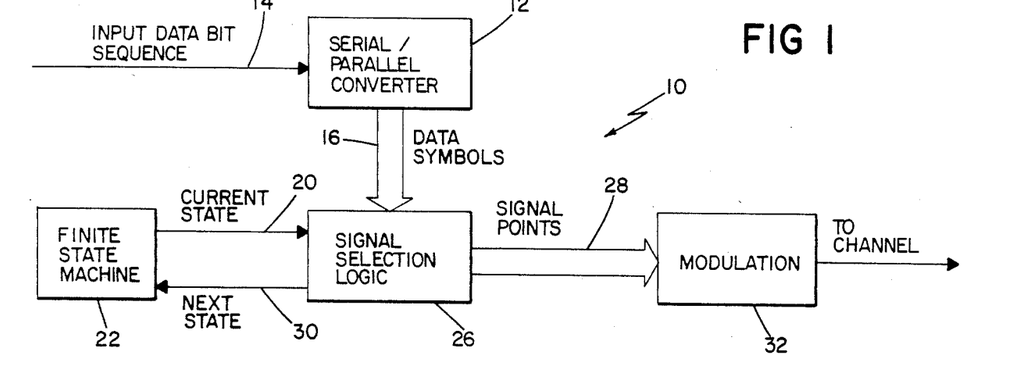
FIG. 1 is a block diagram of a transmitter according to the invention.

Referring to FIG. 1, in general in a transmitter 10 according to the invention, an incoming sequence of data bits 14 is grouped into N-bit data symbols 16 using a conventional serial-to-parallel converter 12. (More generally, the data symbols may be taken from any discrete alphabet, not necessarily of a size equal to a power of two and the incoming sequence of bits or of data symbols may have also undergone some preliminary transformations, such as scrambling for randomization or security, which are of no consequence for the present invention.)

The data symbols 16 are encoded in an encoder comprising signal selection logic 26 and finite-state machine 22 to generate signal points 28 (which are then conventionally modulated for transmission over the channel by modulator 32). The signal points 28 depend not only on the current data symbols 16 but also on the sequence of previous data symbols. The encoder's memory is the finite-state machine 22, which at any time is in one of a finite number (M) of states depending on the history of data symbols, and signal selection logic 26 (implemented by conventional logic techniques) determines both the current signal point 28 and the next state 30 as functions of the current data symbol 16 and the current state 20. Every sequence of data symbols thus determines a corresponding unique sequence of signal points, but not all sequences of signal points can occur.

The signal alphabet comprises a number of subsets, each subset corresponding to transitions from one state to a next state of the finite-state machine, and having its members selected so that the subsets are at least partially overlapping and at least partially disjoint; that is, at least two of the subsets contain at least one signal in common, and at least one signal belongs to only one of the two subsets.

Because the alphabet subsets overlap, fewer signal points are used and implementation is simplified. The signal points which are common to more than one subset are used more often than the other signal points, so that if the more frequent signal points are chosen from the signal alphabet as points requiring less power to transmit, the average power required is less than it would be if all signal points were equiprobable.

Figure 2:
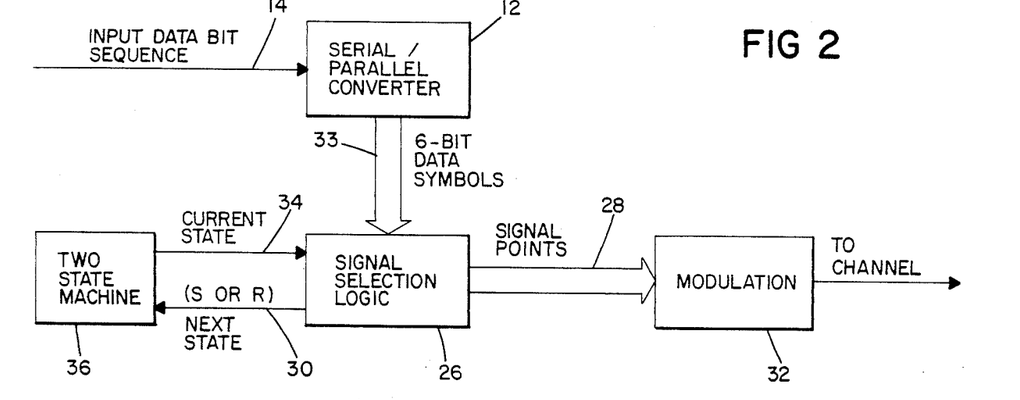
FIG. 2 is a block diagram of a transmitter for six-bit data symbols according to the invention.
Figure 3:
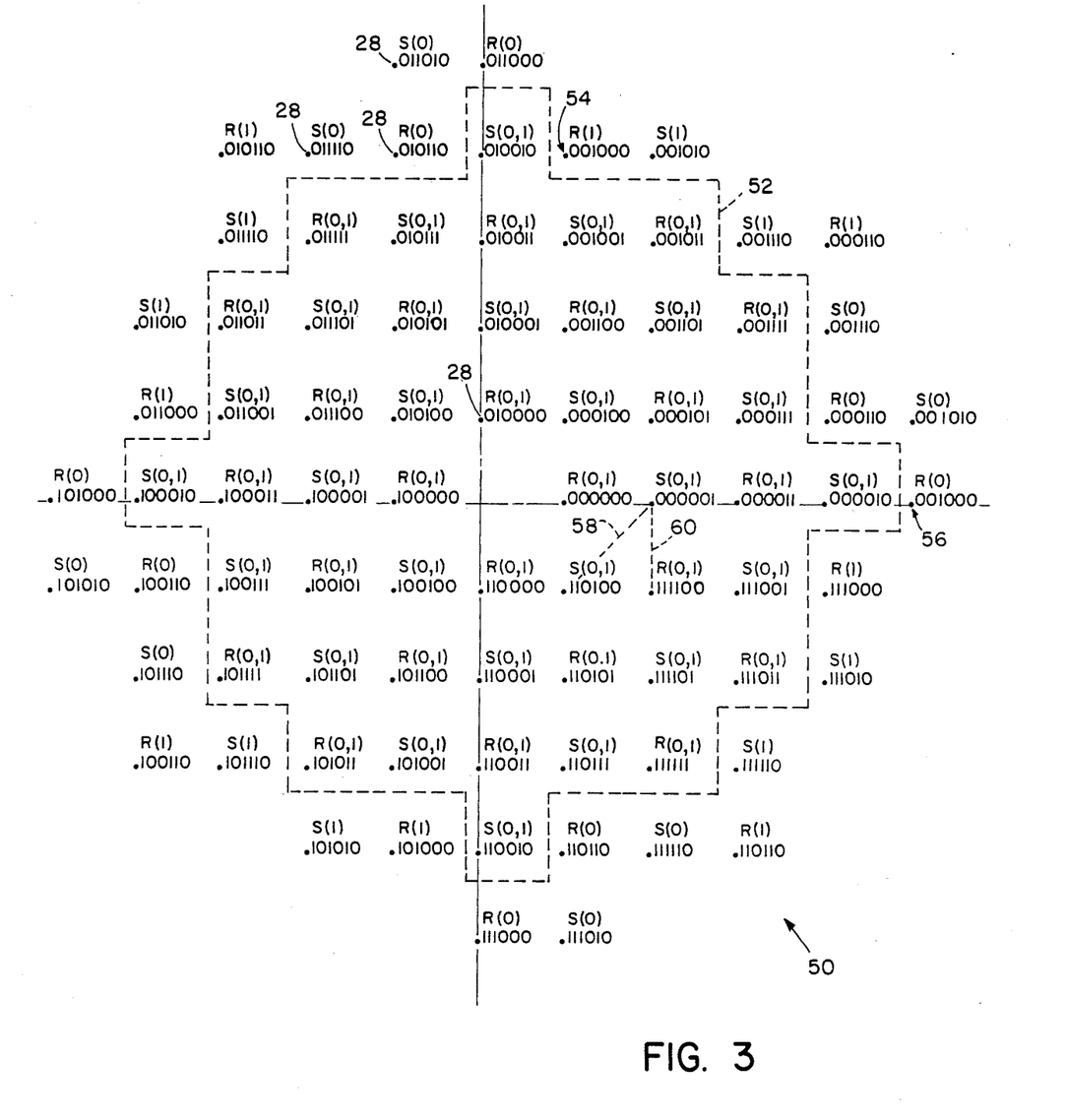
FIG. 3 is a rectangular signal point structure for six-bit data symbols.

Referring to FIG. 2, in preferred embodiments, with a transmitter for sending six-bit data symbols, the size of the data symbol alphabet is $2^N = 2^6 = 64$; and the signal alphabet, illustrated in FIG. 3, has 80 signal points (i.e., 1.25 times $2^N$). Using a simple encoder with only two states, a coding gain of over 2 dB is obtained, which is better than any previously known two-state encoding method. Signal selection logic 26 maps each data symbol 16 into one of the 80 different two-dimensional signal points 28. The next state (0 or 1) of two-state machine 36 is determined by one bit of information 30 (the two values of which can be designated S and R) associated with each signal indicating whether the state should be reversed (R) or remain the same (S) after that signal is transmitted. The transmitter is clocked at the modulation rate (or "baud rate") of modulator 32 so that 6 bits per baud can be transmitted. With quadrature amplitude modulation and efficient use of bandwidth in modulator 32, the transmitter can send nominally 6 bits per Hz of channel bandwidth.

The signal selection logic 26 therefore maps the 64 different data symbols into 80 different signal points using the state of the two-state machine to determine, as to some of the symbols, which of two possible signal points is selected.

Referring to FIG. 3, with the 80 signal points 28 arranged on rectangular signal point grid 50 on the complex signal plane, each point is identified by a six-bit number (the value of the data symbol which may be encoded as that point), a letter (R or S), and one or two numbers in parentheses (indicating the current state or states of the two-state machine which must exist for the indicated data symbol to be encoded as that point). The R or S designation indicates whether the state of the machine is reversed (R) or stays the same (S) when that signal is selected.

The 80 signal points fall into four subsets of 32 points each, which can be called $S_o$, $R_o$, $S_l$ and $R_l$. Subset $S_o$ contains the S-type points which can be reached when the two-state machine is in state 0. $S_l$, $R_o$, and $R_l$ are defined analogously. $S_o$ and $S_l$ have in common the 24 S-type points which are labeled S(0,1) and fall inside boundary 52, and differ in their respective eight S-type points which fall outside boundary 52. $R_o$ and $R_l$ analogously have 24 common points and each have 8 unique points.

Figure 4:
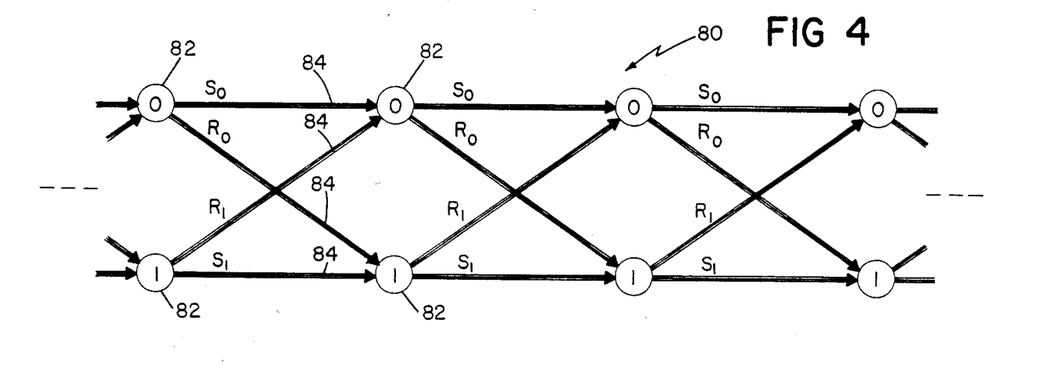
FIG. 4 is a state diagram (trellis) for use with the point structures of FIGS. 3, 6A–6D and 8.

Referring to FIG. 4, trellis 80 (a state transition diagram) shows the possible states 82 occupied by the two-state machine at each time in a sequence of discrete times marking the appearances of successive symbols in the stream. Each vertical pair of circles represents the two possible states at each time. (The top circle represents the 0 state and the bottom circle the 1 state.) Time progresses from left to right.

Trellis 80 also illustrates the possible transitions between states. A branch 84 leads from each state to each of the two states which could occur next. Each branch 84 connecting a 0 state to a 0 state is marked $S_o$ to indicate that it represents the subset of 32 $S_o$ points corresponding to a transition of the two-state machine from a 0 state to the same 0 state. Analogous meanings apply to branches $R_o$, $S_l$ and $R_l$. Over time the sequence of transitions (branches) traces a path through the trellis according to the sequence of states occupied. (Trellis diagrams are more fully described in the *Forney* article cited above.)

Given a starting state, any sequence of data symbols corresponds to a unique path through the trellis and defines the signals sent and therefore the states occupied by the two-state machine over time.

Referring again to FIG. 3, a first group of 48 inner points (enclosed within boundary 52) are associated respectively with 48 of the 64 possible different data symbols. The data symbol associated with each inner point is always encoded as that point, regardless of the state of two-state machine 36 (as indicated by the appearance of both a 0 and a 1 in the parentheses next to each inner point).

In a second group comprising the remaining 32 outer points (which are outside of boundary 52 and thus at least as far from the origin as any of the inner points), two such outer points are associated with each of the remaining 16 data symbols. The outer point into which any of those 16 data symbols is mapped is determined by the current state of the two-state machine (in accordance with the 0 or 1 which appears in parentheses next to that point). For example, points 54, 56 are both associated with data symbol 001000; when the two-state machine is in state 0, data symbol 001000 is encoded as point 56, otherwise it is encoded as point 54. Thus each transmitted outer point can be sent only when the two-state machine is in a particular state. The innermost outer point is as far or farther from the origin than the outermost inner point.

Throughout the signal structure, the R-type and S-type points are alternated in the rows and columns of the grid (as shown) so that each R point has S points as its four nearest neighbors along the lines of the grid and has R points as its four nearest diagonal neighbors, and vice versa. Each pair of diagonally adjacent S points (and each such pair of R points) is separated by a squared distance of $2d_o^2$ (represented for example by line 58 on FIG. 3), where $d_o^2$ is the squared distance between two adjacent points along the grid lines (represented by line 60 on FIG. 3).

The probability of a random selected data symbol being encoded as an outer point is $p=\frac{1}{4}$ (because 16 of the 64 unique data symbols are associated with outer points), so that on average $\frac{1}{4}$ of the points transmitted will carry information about the state of the transmitter's two-state machine. The state of the two-state machine at a given time is equally likely to be 0 or 1 (note that half of the 80 signal points are S points and half are R points).

Subsets $R_o$ and $S_o$ together are the set of 64 signal points which can be encoded from state 0, and subsets $R_l$ and $S_l$ similarly are the set of 64 signal points which can be sent from state 1. These two sets overlap in the 48 inner points but are disjoint as to the 32 outer points.

The points are arranged on the grid with 90° quadrantal symmetry so that, upon rotation of the pattern by any multiple of 90°, each $S_o$ point will lie in the same location that another $S_o$ point occupied before rotation (the $S_o$ subset thus comprising quadruplets of points), and likewise for $S_l$, $R_o$ and $R_l$ points. Because of the symmetry, the receiver can only derive a reference carrier (for coherent demodulation) that has the correct phase modulo 90° (i.e., there is a 90° phase ambiguity); therefore, the correct phase may differ from the received carrier phase by a multiple of 90° without the receiver being able to detect a discrepancy. This desirable arrangement (which requires omitting the grid center point) in combination with quadrantal differential coding techniques of the kind described in Forney et al., U.S. Pat. No. 3,887,768, incorporated herein by reference, allows correct decoding despite the 90° phase ambiguity.

Figure 5:
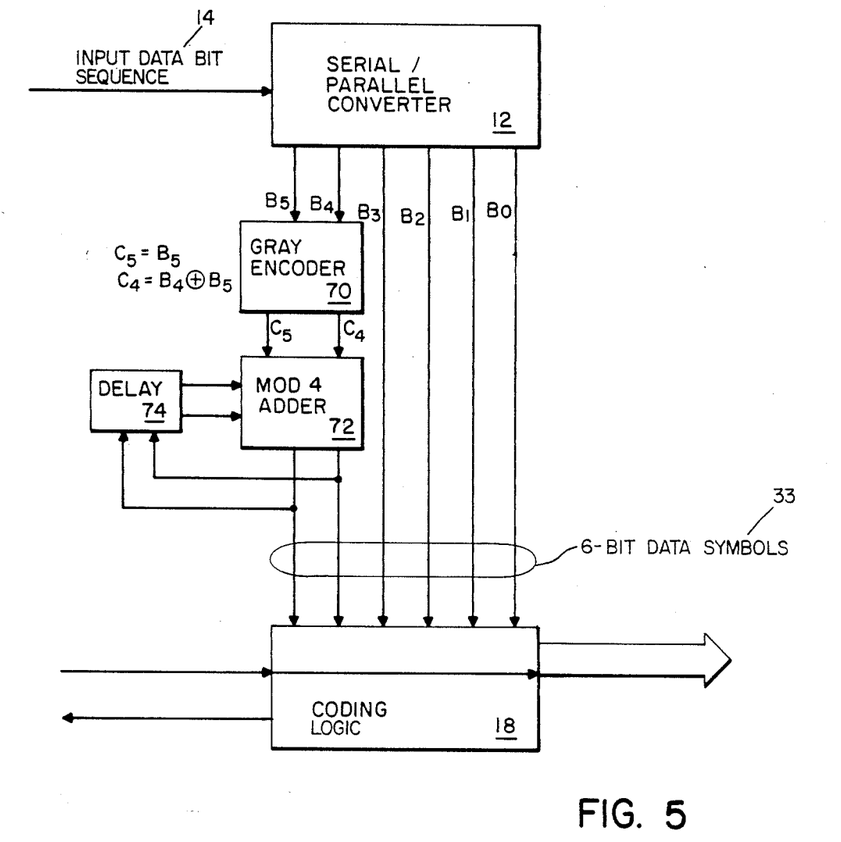
FIG. 5 is a block diagram of a transmitter for six-bit data symbols including a differential encoder.
Figure 6A:
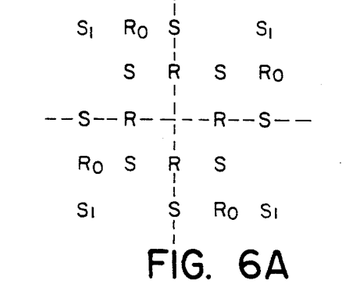
FIGS. 6A, 6B, 6C and 6D are alternative signal point structures for four-bit, five-bit, seven-bit and eight-bit data symbols, respectively.
Figure 6B:
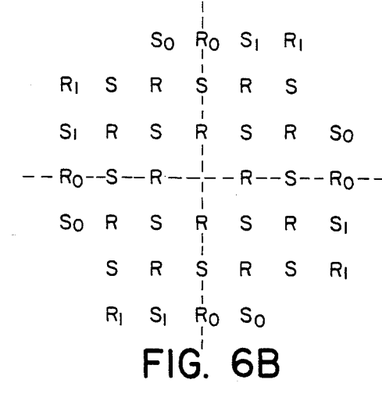
Figure 6C:
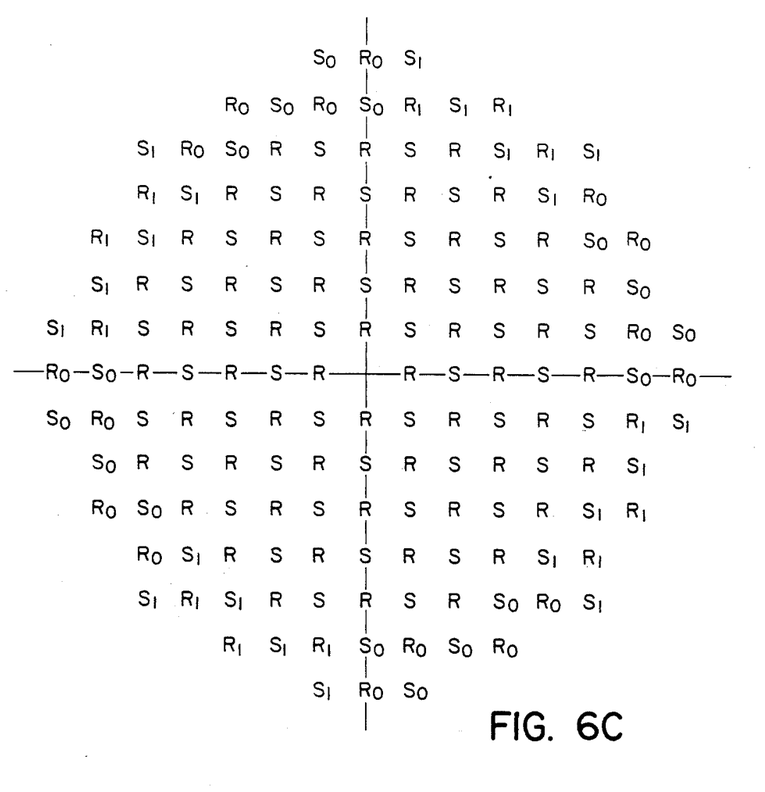
Figure 6D:
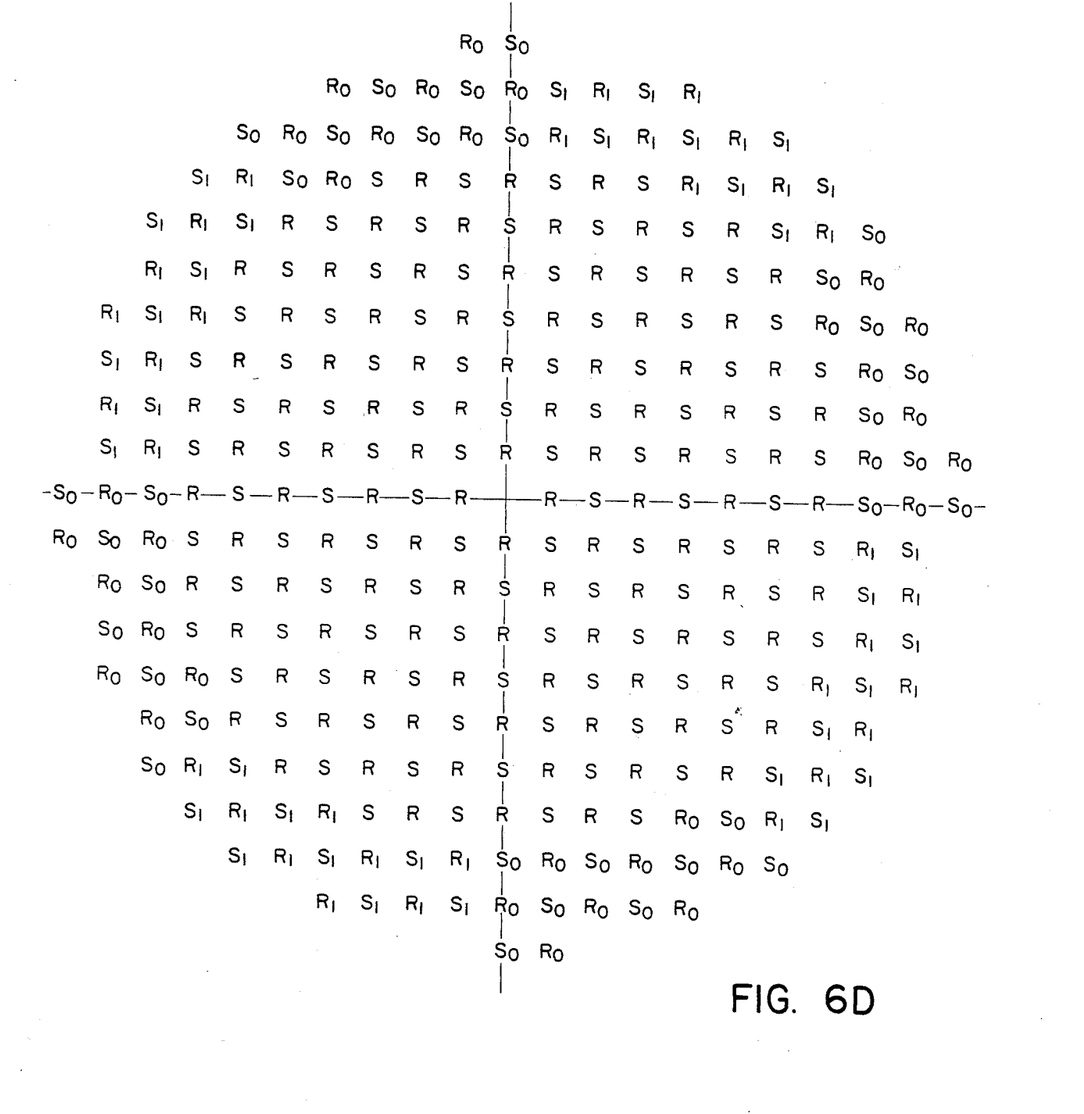

Referring to FIG. 5, a differential encoding transmitter has Gray encoder 70 (which exclusive ORs the most significant two bits of each data symbol 33), modulo 4 adder 72 and delay 74, the output of the adder becoming the two most significant bits of the data symbol used by the coding circuitry 18.

Referring again to FIG. 2, a demodulator 104 includes a decoder 106 in which decoding generally is accomplished by maximum likelihood sequence estimation (i.e., determining at each point in time which permissible path through the trellis to the state occupied at that time is the "closest" to the path actually received and therefore has the maximum likelihood of being the one which was sent). The closest path is the one which has the smallest Euclidean distance from the path received, where the Euclidean distance between a possible signal path and the received path is the sum of the Euclidean distances between the respective signal points and received points on each path.

The decoder may use the Viterbi algorithm (described in Forney article cited above) to select the maximum likelihood path. In a preferred embodiment, each received signal is not finally decoded into a unique data symbol until after a delay of 16 signals following receipt of the signal in question. The algorithm determines, as of the current time, the maximum likelihood sequence to reach each of the two possible current states based on a contention between the two paths to each state from the two previous maximum likelihood sequences to the two previous states. Having determined the two new possible maximum likelihood sequences, the decoder selects as the 16th previous data symbol the symbol corresponding to the signal which lies on one or the other of those sequences at that time. (The number 16 is large enough that with high probability that signal will be the same for both contending paths, so that the choice between the two contending paths is unimportant.) Although the outer points occur only with frequency $\frac{1}{4}$, this rate of occurrence is frequent enough so that the probability of no outer point appearing within 16 signals is $(\frac{3}{4})^{16}$ or about 1%, which is suitably small. The total number of signal points, and thus the proportion of outer points, can be selected to trade off the additional power requirements against the coding gain produced by the addition of more signal points, and the delay period can be selected to trade off delay and memory requirements against higher error probability due to premature decisions.

The performance of the encoding arrangement in the presence of Gaussian noise can be determined by principles set forth in the Forney article, cited above, and is determined primarily by the free distance, $d_{free}$, defined as the minimum squared Euclidean distance between any two distinct paths through the trellis from the time they diverge to the time they merge again. With this coding scheme, the minimum free distance between distinct paths is $2d_o^2$. Because the coding scheme assures a minimum free distance which is twice that of an uncoded system (in which $d_{free}=d_o^2$), the coding scheme can produce a theoretical coding gain (at low error probabilities) of 3 dB.

This coding gain is obtained because the disjointedness of $S_o$ and $S_l$ (and $R_o$ and $R_l$) assures that the average number of paths that diverge from the sent path at a given time and are at the free distance from a sent path is finite and is approximately $16/p=64$, where $p=\frac{1}{4}$ is the probability of an outer point. The error probability is proportional to this average number, which is called the error coefficient. Sending an outer point provides information which aids the receiver in determining the correct sequence of states of the transmitter's two-state machine, while sending an inner point provides no such aid.

If only inner points were sent (i.e., if subsets $S_o$ and $S_I$ (and $R_o$ and $R_I$) overlapped completely), there would be infinitely many possible paths through the trellis within a distance $d_{free}$ of the sent path (because there would be no difference between any one path and a second path going through a complementary sequence of states), and the system would have no advantage over an uncoded system.

The theoretical coding gain of 3 dB (over an uncoded signal structure) is reduced by the additional power required by the additional 16 signal points used in the coded structure (in order to establish the disjoint subsets, i.e., $R_o$ not equal to $R_I$ and $S_o$ not equal to $S_I$). The additional power required is about $1 + p^2$ or $1 + 1/16$ or 0.26 dB, leaving a net asymptotic coding advantage of 2.75 dB over an uncoded system. The small probability (p) of occurrence of the outer points, while requiring a relatively small amount of added power, also produces a higher coefficient (16/p) which further reduces the net coding gain for non-asymptotic error probabilities. With $p = \frac{1}{2}$, net coding gains of 2 dB at error probabilities of the order of $10^{-5}$ are achieved in the presence of Gaussian noise. For low error probabilities, p can be kept as small as desired to keep the coding gain as close to 3 dB as desired. The coding gain is achieved using only two states in the finite state machine and only 25% more signal points than in an uncoded system, which enables less complex and more economical implementation.

Using fewer than $2^{N+1}$ signal points also makes the detected signal points (before decoding) more reliable, enabling tentative decoding decisions to be used in the feedback loops of the receiver (e.g., adaptive equalizer coefficient update, timing recovery, and carrier recovery) before the final delayed decoding decision is reached.

FIGS. 6A, 6B, 6C and 6D show rectangular signal structures which can be used for double side-band (DSB) modulation, with $p = \frac{1}{4}$, $M = 2$, and for $N = 4, 5, 7$ and 8, respectively. (In each of FIGS. 6A, 6B, 6C and 6D, the specific data symbols associated with the signal points are not identified; the inner points are shown without subscripts and the outer points are shown with the relevant state subscripts.) The general rule for arranging the signals on the grid is to use $0.75 \times 2^N$ inner points and $0.5 \times 2^N$ outer points, breaking them into four subsets $S_o$, $R_o$, $S_I$, $R_I$ symmetrically.

Figure 7A:
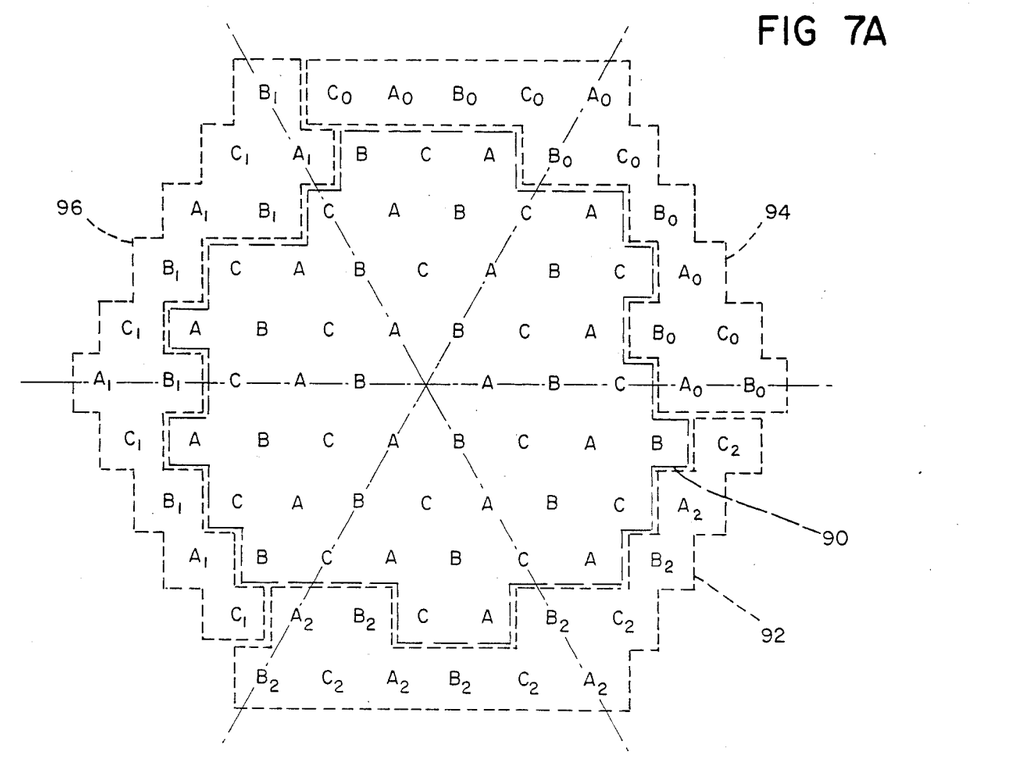
FIG. 7A is a hexagonal signal point structure for six-bit symbols.
Figure 7B:
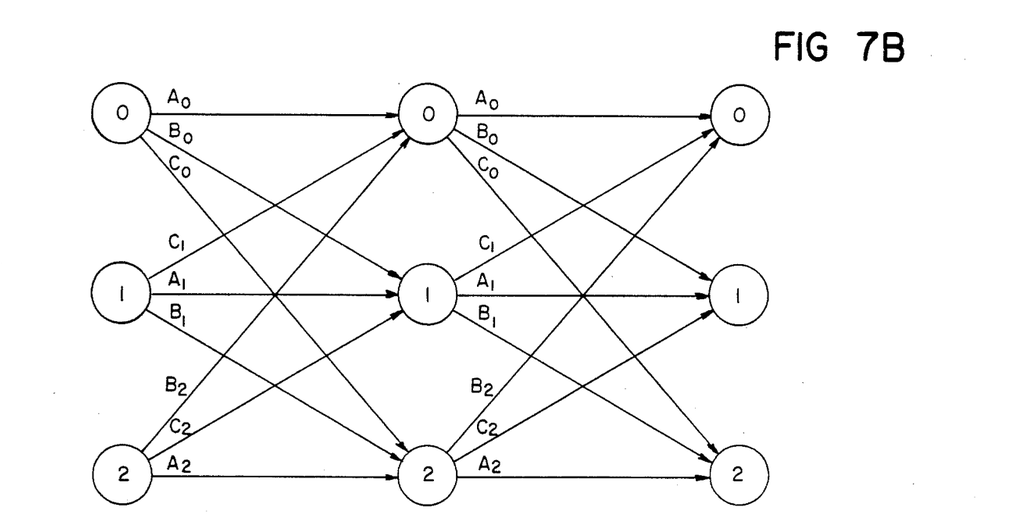
FIG. 7B is a trellis for use with FIG. 7A.

Referring to FIG. 7A, in other embodiments hexagonal signal structures may be used. (The closer packing of a hexagonal grid provides an inherent 0.6 dB advantage over rectangular grids.) FIG. 7A is suitable for $N = 6$, $M = 3$ and DSB modulation. The points are divided into three types (called A, B and C). Each point of one type (e.g., an A point) has points of other types (i.e., B and C points) as its nearest neighbors in the grid and has points of the same type (i.e., A points) as its next nearest neighbors not along the grid dimensions. Thus the minimum squared distance between points of one type is three times the squared distance between adjacent points on the grid. There are 51 inner points (18 A, 15 B and 18 C) within boundary 90 and 39 outer points (12 A, 15 B and 12 C). The outer points are arranged in three clusters (respectively located within boundaries 92, 94, 96), each cluster being associated with one of the states (0, 1 or 2) of the finite-state machine, as indicated by a subscript next to each outer point. The corresponding trellis of FIG. 7B has three possible states in each symbol interval. In the transmitter, the signal selection circuitry maps data symbols one-to-one into inner signal points and one-to-three into outer signal points. The signal selection circuitry also determines the next state; from any one state, all A points lead to one next state, all B points to a second next state, and all C points to a third next state.

The power loss associated with the additional outer points in the hexagonal structure is approximately $1 + 2p^2$ (slightly higher than for the rectangular structure) and the coefficient is 18/p, also slightly higher. The coding gain can approach 3 dB over an uncoded hexagonal structure, which in turn is inherently about 0.6 dB more efficient than a rectangular grid, being closer packed.

Figure 8:
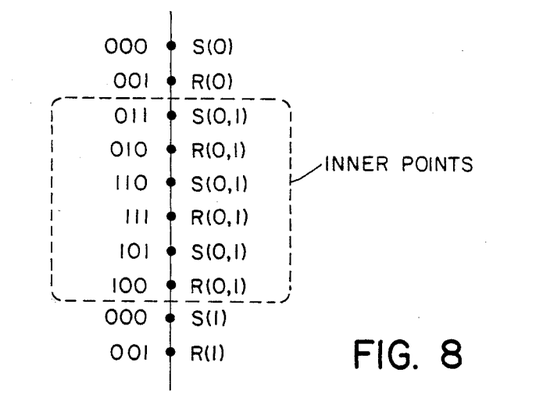
FIG. 8 is a one dimensional signal point structure for three-bit symbols.

Referring to FIG. 8, in another embodiment a signal structure for SSB-AM modulation has $N = 3$ and $M = 2$, and the signal points are arranged along a line with the inner points clustered in the middle of the line. The corresponding trellis may be the same as the trellis of FIG. 3.

OTHER EMBODIMENTS

Other embodiments are within the following claims.

For example, the data symbols can be from any discrete alphabet of any size (not necessarily an integer power of two), the state machine can be a finite-state machine having any integral number of states M, the coding structure can be used with modulation/demodulation schemes other than DSB, the signal point structure can be arranged hexagonally, rather than rectangularly, and the number of outer points can be adjusted to change p so that power loss can be traded for coefficient increase.

I claim:

1. Apparatus for sending digital symbols by transmitting discrete signals corresponding to said symbols over a band-limited channel using a modulated carrier system, said discrete signals being drawn from an alphabet of available signals, comprising
    a finite-state device that occupies, at any given time, one state from among a finite number of possible states, said one state depending on previously sent said symbols, each possible transition from a previous said state to a current said state being associated with a subset of said alphabet signals,
    signal selection logic comprising means to receive each said symbol to be sent, to receive a current state from said finite state device, and to deliver a corresponding said signal selected from one said subset among a plurality of said subsets whose respective members are such that at least two of said subsets have at least one said available signal in common, and at least one said available signal belongs to only one said subset, and
    a modulator for modulating a carrier in accordance with said delivered signal.

2. The apparatus of claim 1 wherein the number of different possible said symbols is $2^N$, and the size of said signal alphabet is larger than $2^N$ and smaller than $2^{N+1}$.

3. The apparatus of claim 1 wherein some said signals (belonging to a first group) are selected by said signal selection logic without regard to said current state of said device, and other said signals (belonging to a second group) are selected by said signal selection logic based on said current state of said device.

4. The apparatus of claim 1 wherein said alphabet of available signals comprises a plurality of types of said signals arranged on a signal plane, the Euclidean distance in said plane between adjacent said signals belonging to the same said type being greater than the Euclidean distance in said plane between adjacent said signals belonging to different said types, and said current state depends on the said type to which said selected signal belongs and on said previous state.

5. The apparatus of claim 4 wherein said available signals are arranged on a rectangular grid, signals from different said types being alternated along each of the dimensions of said grid.

6. The apparatus of claim 1 wherein
said subsets each comprise quadruplets of available signals located at the same distance from the origin of the complex signal plane but separated by 90° intervals about said origin, and
said signal selection logic quadrantally differentially encodes said symbols.

7. The apparatus of claim 1 wherein a first group of said alphabet signals, comprising signals belonging to more than one said subset, is relatively closer in Euclidean distance to the origin on the complex signal plane than is a second group of said alphabet signals comprising signals belonging to only one said subset.

8. The apparatus of claim 7 wherein on the average no more than $\frac{1}{2}$ of said signals selected belong to said second group.

9. The apparatus of claim 7 wherein the innermost signal belonging to said second group is no nearer to said origin than the outermost signal belonging to said first group.

10. The apparatus of claim 7 further comprising a demodulator having a decoder of the type which delays the decision of which signal was transmitted until a number of subsequent signals have been received, said decision being made based on maximum likelihood sequence estimation, and wherein said number is selected to assure to a predetermined probability that said subsequent signals will include at least one signal belonging to said second group.

11. The apparatus of claim 1 further comprising a demodulator having a decoder arranged to make tentative decisions about which signal was transmitted, prior to final decoding of said received signals, and said demodulator comprises adaptive control circuitry arranged to be responsive to said tentative decisions.

12. The apparatus of claim 1 wherein said signals are arranged in a rectangular grid on the complex signal plane.

13. The apparatus of claim 1 wherein said signals are arranged in a hexagonal grid on the complex signal plane.

14. The apparatus of claim 1 wherein there are no more than 1.5 times $2^N$ said signals.

15. The apparatus of claim 1 wherein said modulated carrier system is a double side-band system.

16. The apparatus of claim 1 wherein said modulated carrier system is a single side-band system.

17. The apparatus of claim 2 wherein N is 6, there are 80 said signals, there are 2 said states, and said signals are arranged on a rectangular grid in the complex signal plane.

* * * * *

UNITED STATES PATENT AND TRADEMARK OFFICE
CERTIFICATE OF CORRECTION

PATENT NO. : 4,562,426

DATED : December 31, 1985

INVENTOR(S) : George D. Forney, Jr.

It is certified that error appears in the above-identified patent and that said Letters Patent is hereby corrected as shown below:

Col. 7, line 23, "p=1/2" should be -- p=1/4 --.

Figure 2 should appear as shown on the attached sheet.

UNITED STATES PATENT AND TRADEMARK OFFICE
CERTIFICATE OF CORRECTION

PATENT NO. : 4,562,426
DATED : December 31, 1985
INVENTOR(S) : George D. Forney Jr.

It is certified that error appears in the above-identified patent and that said Letters Patent are hereby corrected as shown below:

FIG 2

Signed and Sealed this

Seventeenth Day of February, 1987

Attest:

DONALD J. QUIGG

Attesting Officer

Commissioner of Patents and Trademarks